United States Patent [19]

Otori et al.

[11] Patent Number: 5,859,807

[45] Date of Patent: Jan. 12, 1999

[54] SEMICONDUCTOR INTEGRATED CIRCUIT DEVICE HAVING A CONTROLLED OVERDRIVING CIRCUIT

[75] Inventors: Hiroshi Otori, Ome; Takesada Akiba, Tachikawa; Goro Kitsukawa, Hinode-machi, all of Japan; Hugh McAdams, McKinney, Tex.

[73] Assignee: Hitachi, Ltd., Japan

[21] Appl. No.: 847,350

[22] Filed: Apr. 24, 1997

Related U.S. Application Data

[60] Provisional application No. 60/009,984 Jan. 26, 1996.

Related U.S. Application Data

[63] Continuation-in-part of Ser. No. 782,225, Jan. 13, 1997, abandoned.

[51] Int. Cl.[6] .................................................. G11C 7/00
[52] U.S. Cl. ...................... 365/208; 365/189.11; 365/190
[58] Field of Search .................................. 365/208, 203, 365/120, 189.11

[56] References Cited

U.S. PATENT DOCUMENTS

| | | | |
|---|---|---|---|
| 4,404,660 | 9/1983 | Menachem | 365/193 |
| 4,893,278 | 1/1990 | Ito | 365/203 |
| 5,257,232 | 10/1993 | Dhong et al. | 361/203 |
| 5,325,337 | 6/1994 | Buttar | 365/220 |
| 5,418,749 | 5/1995 | Suda et al. | 365/203 |

FOREIGN PATENT DOCUMENTS

| | | |
|---|---|---|
| S.63-168206 | 7/1988 | Japan . |
| H.02-224771 | 8/1990 | Japan . |

*Primary Examiner*—Tan T. Nguyen
*Attorney, Agent, or Firm*—Haynes and Boone, L.L.P.

[57] ABSTRACT

The present invention is a method and apparatus for overdriving signals received by a sense amplifier circuit. To this end, an overdrive circuit drives the signal to be sensed for a period of time to a voltage level greater than a normal level. The length of the period of time corresponds to the location of the sense amplifier circuit relative to a sense enabling circuit. Upon completion of the overdriving, a normalization circuit drives the signal to be sensed for a second period of time to the normal level, thereby preparing it for the next memory cycle so that the signals can be once again set to a desired precharge level.

37 Claims, 9 Drawing Sheets

SEMICONDUCTOR INTEGRATED CIRCUIT DEVICE HAVING A CONTROLLED OVERDRIVING CIRCUIT

CROSS REFERENCE

This application is a continuation-in-part of U.S. Pat. application No. 08/782,225, filed on Jan. 13, 1997, now abandoned which claims the benefit of U.S. Provisional Application No. 60/009,984, filed Jan. 26, 1996, now abandoned.

BACKGROUND OF THE INVENTION

The invention relates generally to semiconductor circuit design and, more particularly, to a method and apparatus for controlled overdriving on a sense amplifying circuit.

Digital logic requires input and output data signals to meet defined voltage levels to be interpreted as either "high" or "low." However, typical integrated circuits, or "chips," utilizing digital logic also include data signals at many voltage levels. As a result, sense amplifying circuits are utilized to interpret, or "separate" the data signals, driving them to a target high or low voltage level, thereby producing the correct voltage level for other digital circuits on the chip. For example, a capacitor-type memory cell for a dynamic random access memory ("DRAM") device utilizes very small bit signals. Sense amplifier circuits residing on the DRAM device separate the bit signals by comparing them to a precharge level, which is defined as a level between the high and low levels of the memory cell. If the level of the bit signal is above the precharge level, then the sense amplifier circuit interprets the signal as a high, or logic 1, signal and drives the bit signal to the target high voltage. If the level of the bit signal is below the precharge level, then the sense amplifier circuit interprets the signal as a low, or logic 0, signal and drives the bit signal to the target low voltage.

As technology progresses, the speed and accuracy of sense amplifier circuits become more critical. For this reason, chip designers have tried various methods to speed up the signal separation. For example, U.S. Pat. No. 5,257,232 to Dhong et al. teaches a method of overdriving a sense amplifier circuit to speed up the signal separation. Although this method succeeds in separating the signals quickly, it has drawbacks. One such drawback is that the overdriving is inaccurate because when the sensing is complete, the bit signals do not end up at the target high and low voltage levels. Therefore, during an equalization period, the bit signals do not return to the desired precharge level. Instead, the bit signals return to a level that is offset, due to the overshot voltage during the sensing. As a result, the precharge level becomes altered, and the sense amplifier circuits do not interpret the next bit signal correctly.

Therefore, what is needed is a method and apparatus for overdriving signals to achieve fast signal separation, while maintaining the accuracy of sense amplifier operation.

SUMMARY OF THE INVENTION

The present invention, accordingly, is an improved method and apparatus for overdriving signals received by a sense amplifier circuit. To this end, an overdrive circuit drives the signal to be sensed for a period of time to a voltage level greater than a normal level. The period of time during which the signal is overdriven corresponds to the location of the sense amplifier circuit relative to a sense enabling circuit. Upon completion of the overdriving, a normalization circuit drives the signal to be sensed for a second period of time to the normal level, thereby preparing it for the next memory cycle so that the signals can be once again set to a desired precharge level.

A technical advantage achieved with the present invention is that it enables sense amplifiers to separate the bit lines quickly, while maintaining accuracy.

Another technical advantage achieved with the present invention is that the length of time a signal is overdriven is directly related to the location of the sense amplifier relative to the sense enabling circuit.

DETAILED DESCRIPTION OF THE PREFERRED EMBODIMENT

Figure 1:
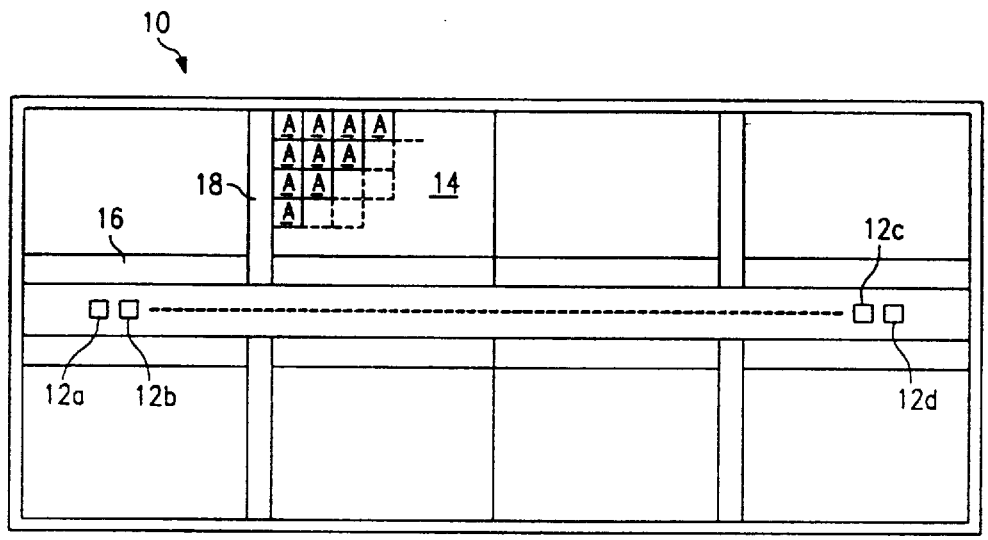
FIG. 1 is a block diagram of a 256 Mbit DRAM embodying features of the present invention.

In FIG. 1, the reference numeral 10 refers to a memory device embodying features of the present invention. While in a preferred embodiment of the invention, the device 10 is a 256 Mbit dynamic random access memory ("DRAM"), it should be understood that the present invention is not limited to use with a DRAM, but may be used in conjunction with any integrated circuit device that requires accurate, high speed, signal amplification.

The device 10 includes a number of control signal pads and power pads, The control signal pads include address pads 12a–12b, each of which is connected to an external controller (not shown). The power pads include a positive power supply (VDD) pad 12c and a negative or ground power supply (VSS) pad 12d, each connected to an external power supply (not shown). The device 10 also includes a set of array blocks of memory cells, such as an array block 14, and a group of main address decoders, such as a column decoder 16 and a row decoder 18. The array blocks are selected by signals from the address pads 12a, 12b, through the main address decoders 16, 18. Array block 14, which is representative of the remaining array blocks, is further divided into many subarrays, each generally referenced by the letter A and discussed in greater detail below in relation to FIG. 3.

Figure 2:
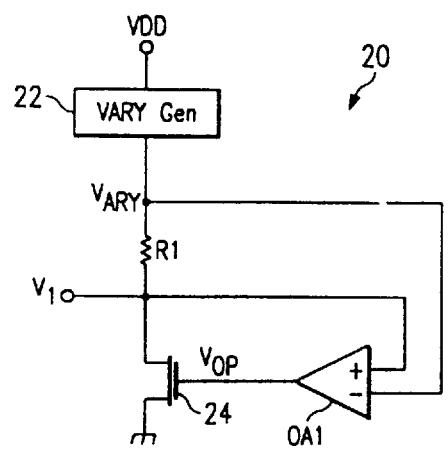
FIG. 2 is a schematic block diagram of a voltage generator.

Referring to FIG. 2, in addition to the VDD and VSS power supplies, the device 10 includes a voltage circuit 20 for producing an internal voltage V1. The voltage circuit 20 includes an array power supply (VARY) generator 22, a resistor R1, a transistor 24, and an operational amplifier (op amp) OP1. The VARY generator 22 is a conventional voltage generator for producing a stable and consistent voltage VARY such that VSS<VARY<VDD.

In normal operation, no current is flowing through the resistor R1, and therefore the voltage V1 is equal to VARY. As a result, the op amp OP1 has an output VOP equal to VSS, and the transistor 24 remains off. However, during overdrive operations, external power sources, to be discussed later, pull V1 above VARY. When this happens, the op amp output VOP is greater than VSS, and the transistor 24 turns on, thereby pulling V1 to ground. As V1 is being pulled towards VSS by the transistor 24, it reaches a point where V1 is equal to VARY. At this time, the op amp output VOP is once again equal to VSS, and the transistor 24 turns off.

For the remainder of the detailed description, the array block 14 will be described, along with only a few subarrays and circuits associated with the array block. However, it should be understood that the discussion of the array block 14, individual subarrays of array block 14, individual bits of the subarrays, and circuits surrounding the subarrays, are limited in quantity only for ease in description. Therefore, the remaining description is a simplified version of the preferred embodiment and is intended to illustrate, and not to limit, the invention.

Figure 3:
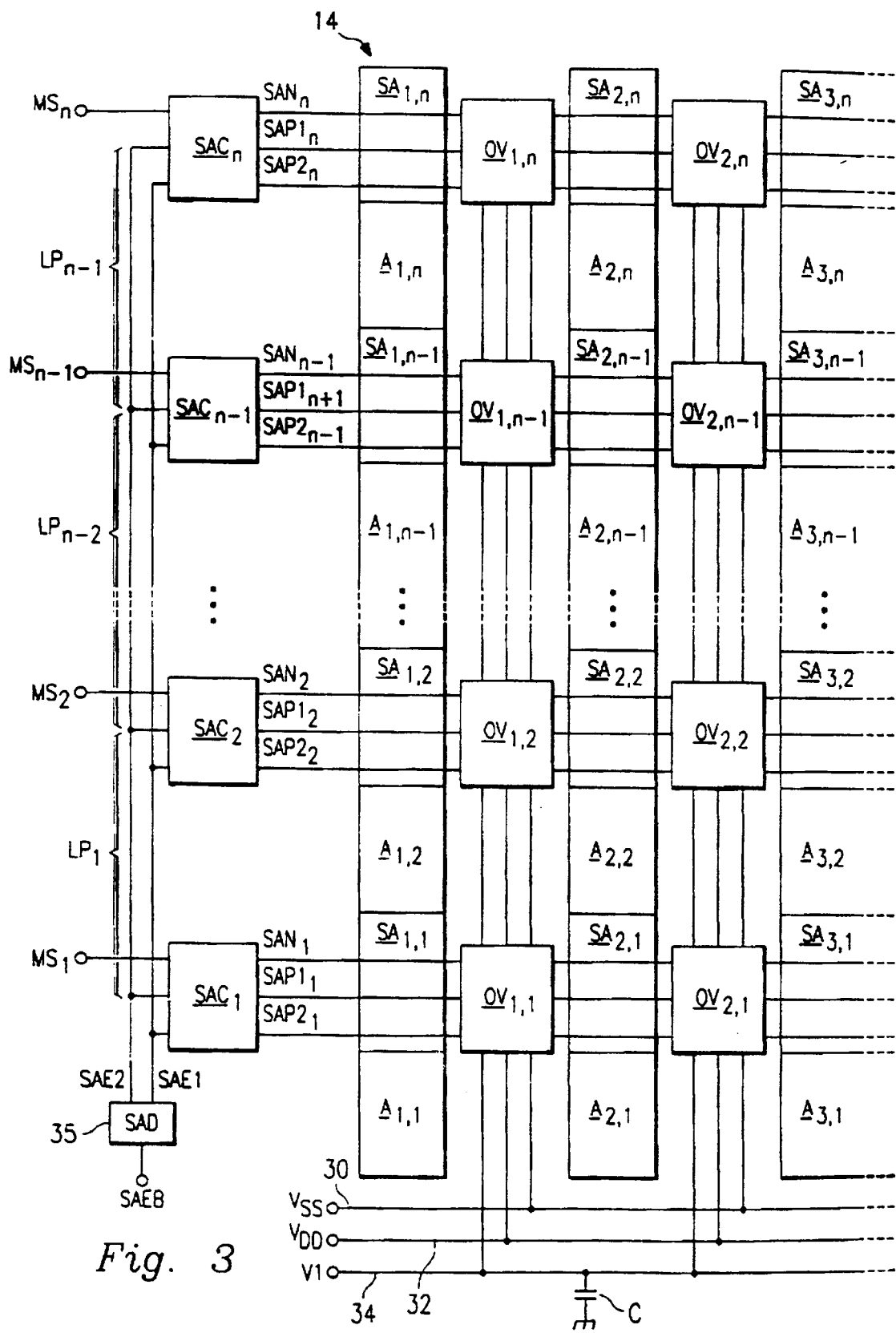
FIG. 3 is a block diagram of an array block of the 256 Mbit DRAM of FIG. 1.

Referring to FIG. 3, the array block 14 comprises m*n subarrays $A_{x,y}$, such that $1 \leq x \leq m$ and $1 \leq y \leq n$. The subarrays are accordingly referenced in column, row form and include subarrays $A_{1,1}$–$A_{m,n}$. The row of subarrays $A_{x,1}$ comprises the subarrays closest to the center of the device 10 (FIG. 1), and the row of subarrays $A_{x,n}$ comprises the subarrays farthest from the center of the device. Associated with each subarray $A_{x,y}$ is a sense amplifier area $SA_{x,y}$ and an overdrive control circuit $OV_{x,y}$. For example, the sense amplifier area $SA_{1,1}$ and the overdrive control circuit $OV_{1,1}$, are associated with the subarray $A_{1,1}$. Furthermore, associated with each row of subarrays $A_{x,y}$ is a sense amp control circuit $SAC_y$, a select signal $MS_y$, and sense signals $SAN_y$, $SAP1_{yx}$, and $SAP2_y$. For example, the sense amp control circuit $SAC_1$, $MS_1$, select signal $SAN_1$, and the $SAP1_1$, and $SAP2_1$ sense signals are associated with the subarrays $A_{1,1}$, $A_{2,1}$, . . . $A_{m,1}$.

The select signal $MS_1$–$MS_n$ electrically connect circuits (not shown) in the row decoder 18 (FIG. 1) with sense amp control circuit $SAC_1$–$SAC_n$ circuit respectively. Likewise, the sense signals $SAN_1/SAP1_1/SAP2_1$–$SAN_n/SAP1_n/SAP2_n$ electrically connect the sense amp control circuits $SAC_1$–$SAC_n$, with the entire row of overdrive control circuits $OV_{x,1}$–$OV_{x,n}$ respectively. The overdrive control circuits $OV_{x,y}$ are also connected to a VSS power line 30, a VDD power line 32 and a V1 power line 34. The sense amp control circuits $SAC_1$–$SAC_n$ are also connected to two sense amp enable lines SAE1 and SAE2. The VSS and VDD power lines 30, 32 are driven by the VSS and VDD pads 12d, 12c (FIG. 1), the V1 power line 34 is driven by the voltage generator circuit 20 (FIG. 2) and the two sense amp enable lines SAE1 and SAE2 are driven by a sense amp delay (SAD) circuit 35.

Figure 4:
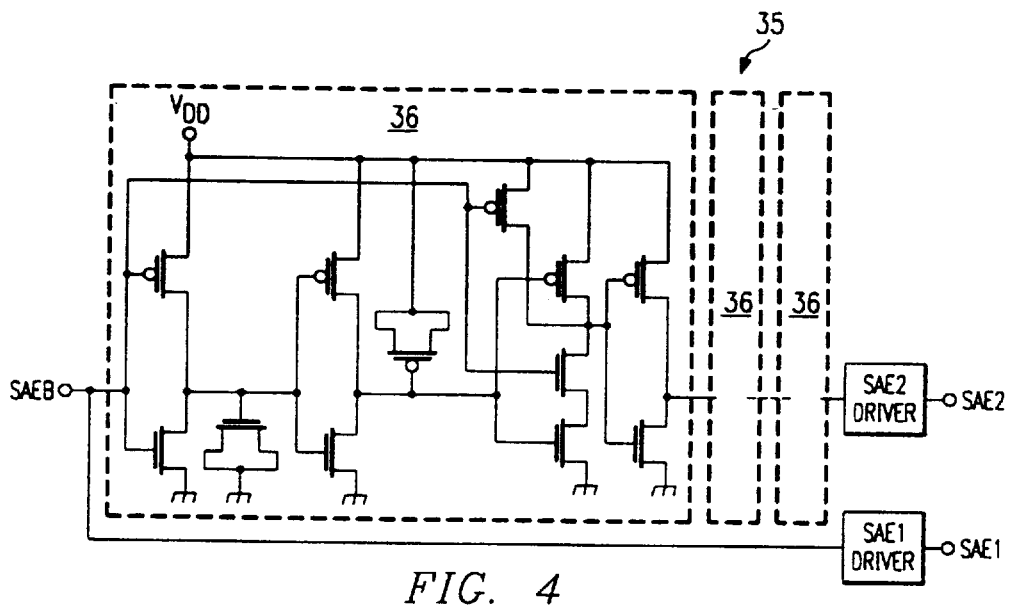
FIG. 4 is a schematic diagram of the sense amplifier delay unit of FIG. 3.

Referring to FIG. 4, the SAD circuit 35 receives a conventional sense amp enable signal, SAEB, and drives the two sense amp enable lines SAE1 and SAE2. The SAE1 signal follows the SAEB signal with only a minimal delay. However, the SAE2 signal follows the SAEB signal after a significant delay caused by a series of delay units 36, each of which comprises a plurality of capacitive loads and inverters to delay the propagation of the SAEB signal.

Each of the remaining circuits, signal lines, sense amp areas and subarrays identified in FIG. 3 are identical. Therefore, FIGS. 5–6, discussed below, will only describe a representative sense amp control circuit, signal lines, sense amp area and subarray. Once again, it should be understood that the discussion of the representative sense amp control circuit, signal lines, sense amp area and subarray, are limited only for ease in description. Therefore, the following description is a further simplified version of the preferred embodiment and is intended to illustrate, and not to limit, the invention.

Figure 5:
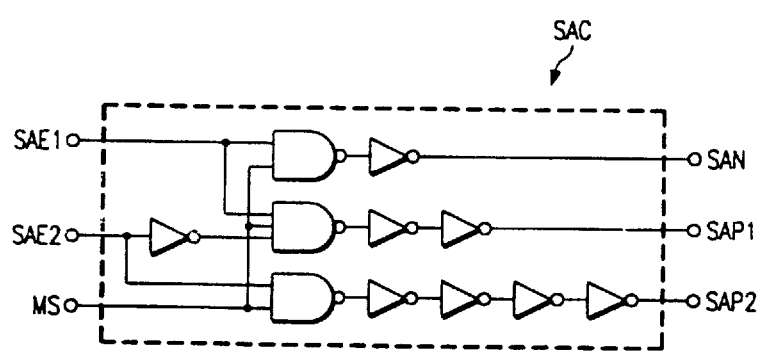
FIG. 5 is a schematic block diagram of one sense amplifier control unit of FIG. 3.

Referring to FIG. 5, the SAC circuit receives the two sense amp enable lines SAE1 and SAE2, and the signal MS and drives the three sense signals SAN, SAP1, and SAP2. The select signal MS is used for memory cell selection, and for this scaled-down representation of the preferred embodiment, it will remain active (high). The SAN sense signal is active high, and the SAP1 and SAP2 sense signals are active low. The SAN signal is activated shortly after the SAE1 signal is activated. Likewise, the SAP1 signal is activated shortly after the SAE1 signal is activated. However, when the SAE2 signal is activated, the SAP1 sense signal is deactivated and the SAP2 sense signal is activated. Therefore, the SAP1 sense signal is active only for the amount of time the SAE2 signal is delayed from the SAE1 signal.

Figure 6:
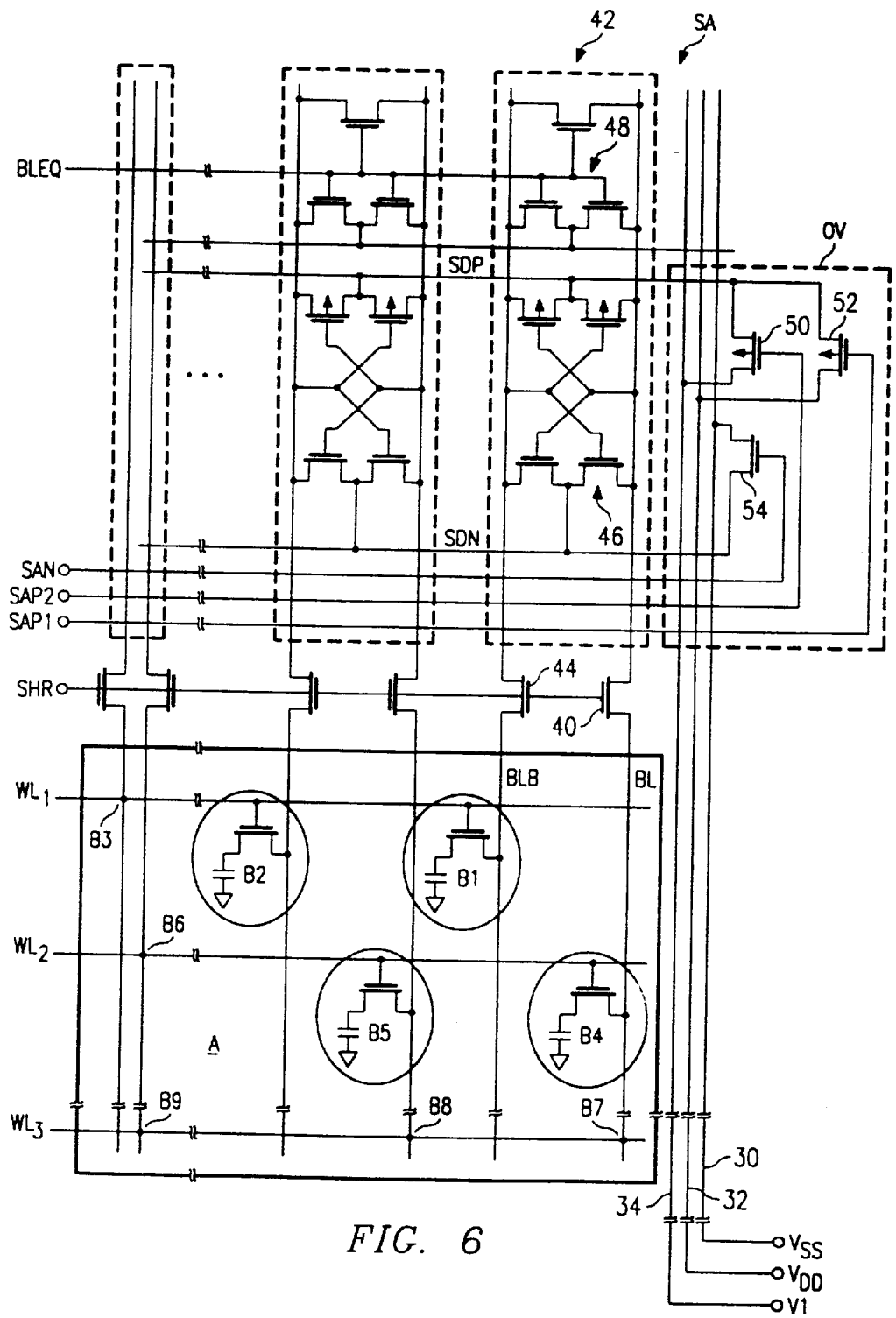
FIG. 6 is a schematic diagram of one subarray of FIG. 3.

Referring to FIG. 6, the subarray A contains a plurality of memory cells, or "bits," represented by bits B1–B9. The bits B1–B9 are identical, some being schematically illustrated for the sake of example. The bits are aligned in rows, wherein each row is activated by a word line. For example, the top row, containing the bits B1–B3, is activated by the word line $WL_1$, and the bottom row, containing the bits B7–B9, is activated by the word line $WL_3$.

Each of the bits is also connected to a bit line. According to the configuration of FIG. 6, the bit lines run vertically through the subarray A, through transfer gates 40, 44, and into individual sense amplifier circuits located in the sense amplifier area SA. For example, a bit line BL is connected to the bits B4 and B7, passes through the transfer gate 40 and into a sense amplifier circuit 42. Likewise, a bit line BLB is connected to the bit B1, passes through the transfer gate 44 and into the sense amplifier circuit 42. The sense amplifier circuit 42 contains a conventional latching section 46 and an equalization section 48. The latching sections of all the sense amplifier circuits in the sense amplifier area SA are controlled by two latching signals SDN and SDP. Likewise, all of the normalization sections are controlled by a signal BLEQ and all the transfer gates are controlled by a signal SHR.

The SDN and SDP latching signals are driven by common source switch transistors, including two p-type metal oxide semiconductor ("PMOS") transistors 50 and 52, and one n-type metal oxide semiconductor ("NMOS") transistor 54, located in the overdrive control circuit OV. The PMOS transistor 50 is connected between the V1 power line 34 and the SDP latching signal line, and its operation is controlled by the SAP2 signal line. The PMOS transistor 52 is connected between the VDD power line 32 and the SDP latching signal line, and its operation is controlled by the SAP1 signal line. The NMOS transistor 54 is connected between the VSS power line 30 and the SDN latching signal line, and its operation is controlled by the SAN signal line.

Figure 7:
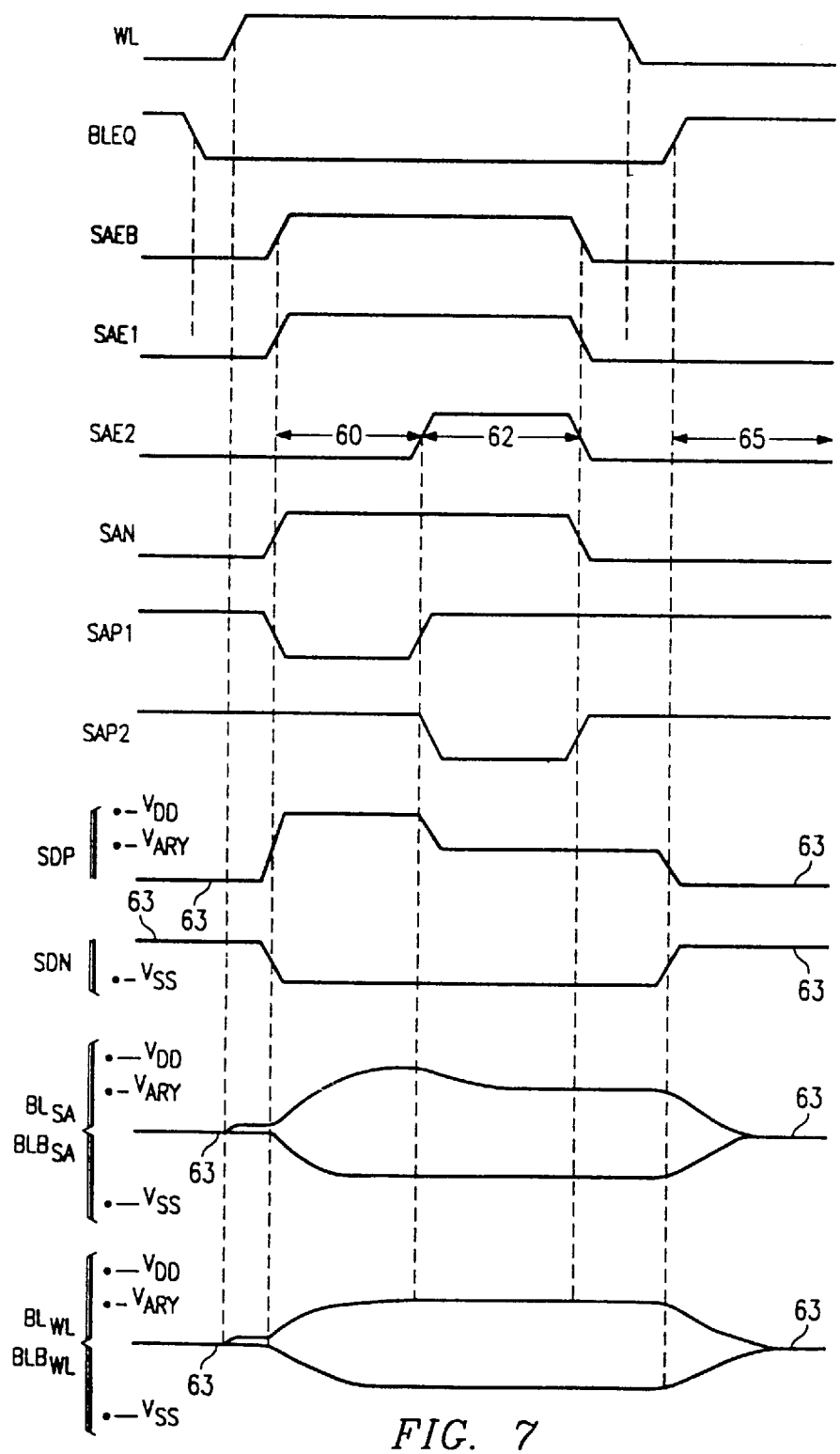
FIG. 7 is a timing diagram of the circuits of FIGS. 4–6.

Referring to FIGS. 5–7, a sensing operation is initiated by the activation of the SAEB signal. Immediately following activation of the SAEB signal, the SAD circuit 35 activates the SAE1 signal. As a result, the SAC circuit activates both the SAN and SAP1 signals, thus beginning an overdrive period 60. The PMOS transistor 52 and the NMOS transistor 54 are enabled, activating the two latching signals SDP and SDN by connecting them to the VDD and VSS, respectively.

In response to the activation of the latching signals SDP and SDN, the data signals on bit lines begin to separate. However, due to the length of the bit lines and the capacitive load resulting from all the bits connected thereto, the portion of the bit lines located in the sense amplifier area SA behaves differently from the portion of the bit lines located in the subarray A. For example, considering the two bit lines BL and BLB, the portion of the bit lines located in the sense amplifier area SA is represented by the timing diagram of $BL_{SA}$ and $BLB_{SA}$. The portion of the bit lines BL and BLB located in the subarray A is represented by the timing diagram of $BL_{WL}$ and $BLB_{WL}$. The bit line portions $BL_{SA}$ and $BLB_{SA}$ are the least affected by the capacitive load of the bits and the signals thereon, and separate very quickly. However, the bit line portions $BL_{WL}$ and $BLB_{WL}$ are the most affected by the capacitive load of the bits and the signals thereon, and separate slower.

The overdrive period 60 is maintained until the $BL_{WL}$ and $BL_{SA}$ bit lines reach the VARY voltage level and the $BLB_{WL}$ and $BLB_{SA}$ reach the VSS voltage level. At that point, the SAC circuit deactivates the SAP1 signal by disabling the PMOS transistor 52 and activates the SAP2 signal by enabling the PMOS transistor 50. As a result, a normalization period 62 begins. During the normalization period 62, the PMOS transistor 50 activates the latching signal SDP by connecting it to the V1 power line. The normalization period 62 brings the signals on bit lines to their desired VARY voltage level. Thereafter, during an equalization period 65, the signals on bit lines will accurately go to a precharge level 63, which is exactly half-way between VARY and VSS, in response to the BLEQ signal. Likewise, the BLEQ signal will equalize the latching signals SDN and SDP, causing them to go to the precharge level 63 during the equalization period 65.

Referring also to FIG. 2, the normalization period 62 is enhanced by the operation of the voltage generator circuit 20. Because the SDP latching signal line was previous connected to VDD, it pulls the V1 voltage up towards the VDD voltage level. As a result, the V1 voltage rises above the VARY voltage generated by the VARY generator 22. Due to the voltage difference on the input of the op amp $OA_1$, the op amp turns on the transistor 24, thereby shorting V1 towards VSS. This discharges the capacitive load of V1 until V1 once again equals VARY. When this occurs, the op amp $OA_1$ turns the transistor 24 off again, and the V1 voltage level stabilizes to the VARY voltage level.

The effect of V1 being pulled towards VSS is more apparent on the bit line portions located in the sense amp areas than the bit line portions located in the subarrays. For example, the $BL_{SA}$ signal, whose voltage level was previously at or near VDD, is pulled down quickly back to VARY. However, the $BL_{WL}$ signal, whose voltage level was previously near VARY, effectively remains at that level due to the high capacitive load of the bits connected to the bit line.

Although FIG. 7 is the timing diagram for a representative subarray A, in the preferred embodiment, the timing diagram of each subarray is a function of its location. For example, the bit line wave form of subarray $A_{1,1}$, representing the row of subarrays closest to the center of the device 10 (FIG. 1), will be different from the bit line wave form of subarray $A_{1,n}$, representing the row of subarrays farthest from the center of the device. This is because load resistance and capacitance of the VDD and VSS power lines increase from the center of the device to the edge of the device. As a result, the $OV_{1,1}$ circuit supplies more VDD and VSS power than $OV_{1,n}$, which causes the signals on the bit lines of subarray $A_{1,1}$, to separate faster than the signals on the bit lines of subarray $A_{1,n}$.

Figure 8:
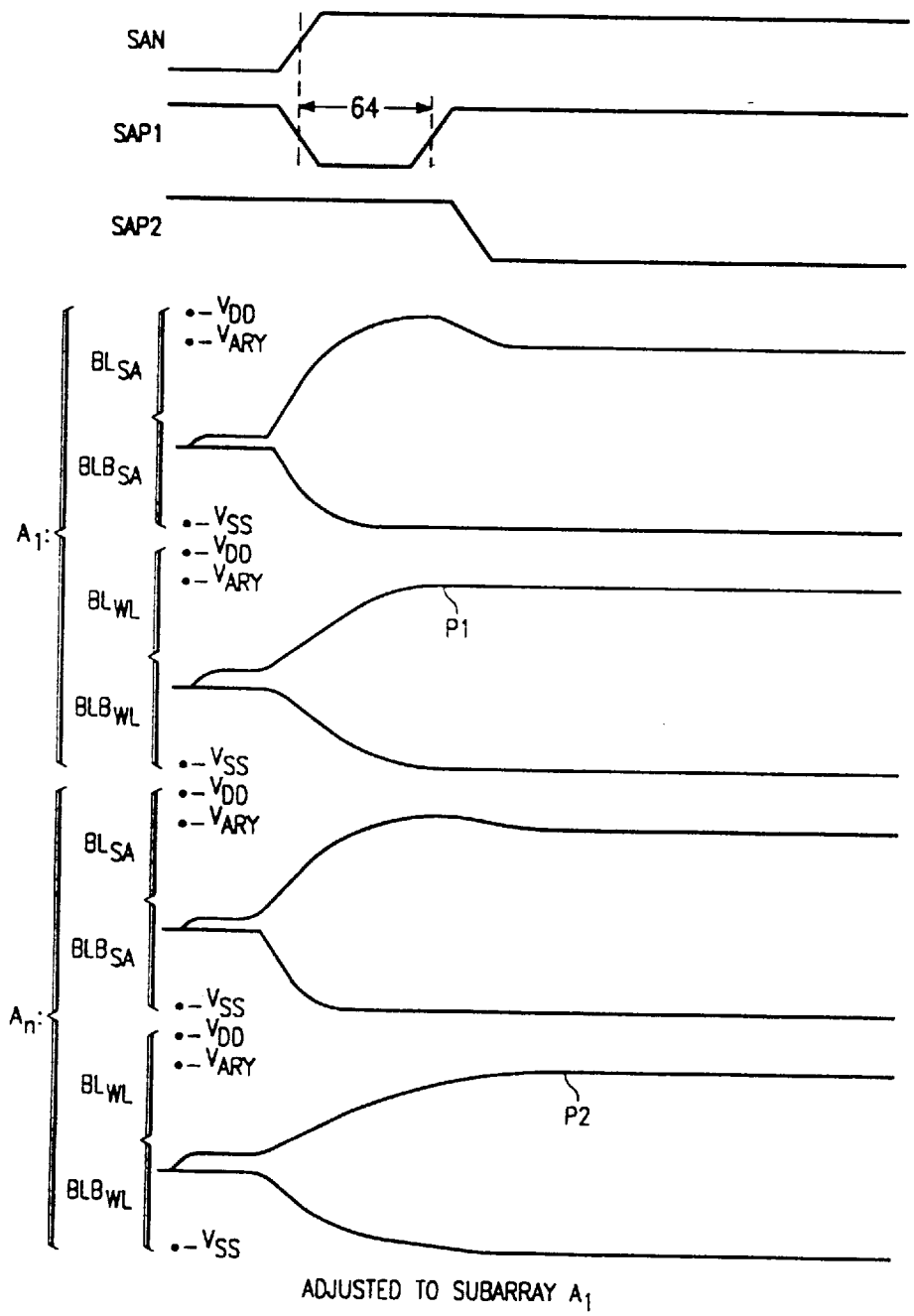
FIG. 8 is a timing diagram of a first implementation of an overdrive circuit of the present invention.

Referring to FIG. 8, in a first implementation, an overdrive period 64 is optimized for the subarray $A_{1,1}$. In this implementation, the period 64 is made just long enough so that the level of the bit line $BL_{WL}$ signal of subarray $A_{1,1}$ reaches the VARY level at point P1. However, in this implementation, the level of the bit line $BL_{WL}$ of subarray $A_{1,n}$ does not reach the VARY level until the point P2. As a result, although this implementation works well for the subarray $A_{1,1}$, it does not provide the full benefit of overdriving to the subarray $A_{1,n}$.

Figure 9:
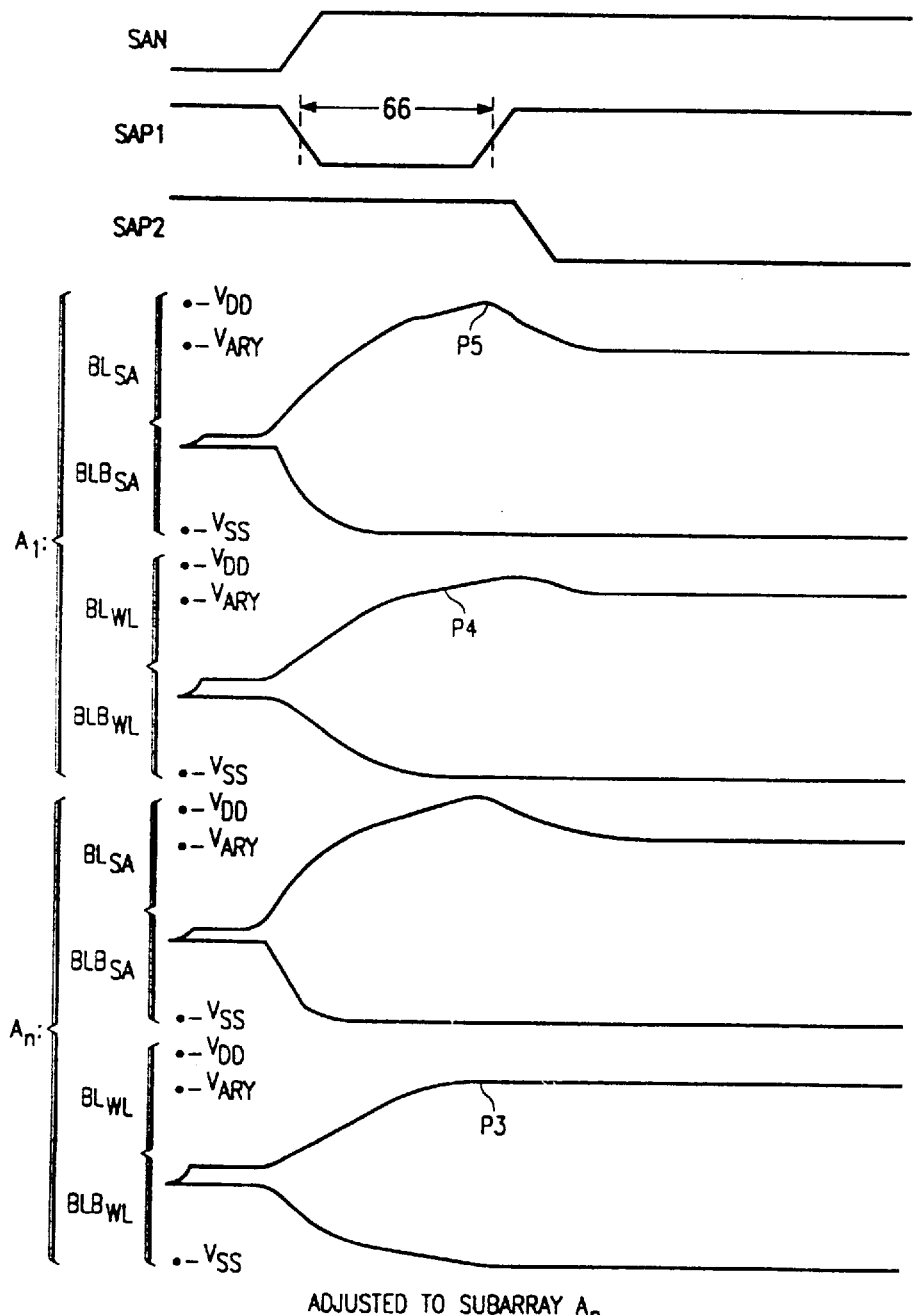
FIG. 9 is a timing diagram of a second implementation of an overdrive circuit of the present invention.

Referring to FIG. 9, in a second implementation, an overdrive period 66 is optimized for the subarray $A_{1,n}$. In this implementation, the delay is made just long enough so that the signal on the bit line $BL_{WL}$ of subarray $A_{1,n}$ reaches the VARY level at point P3. Furthermore, in this implementation, the level of the signal on bit line $BL_{WL}$ of the subarray $A_{1,1}$ also reaches the VARY level quickly, as shown at point P4. However, the overshoot of the signal on bit line $BL_{SA}$ of the subarray $A_{1,1}$ is extremely high, as shown at point P5, and furthermore, the overshoot of the signal on bit line $BL_{WL}$ of the subarray $A_{1,1}$ is higher than the V1 level. As a result, the ability of the $SAP2_1$ signal to pull down the bit line $BL_{SA}$ and $BL_{WL}$ of the subarray $A_{1,1}$ during the normalization period (FIG. 7) becomes difficult. Some relief can be accomplished by connecting a capacitance C to the V1 line (FIG. 3), thereby stabilizing the V1 voltage level during the normalization period.

Figure 10:
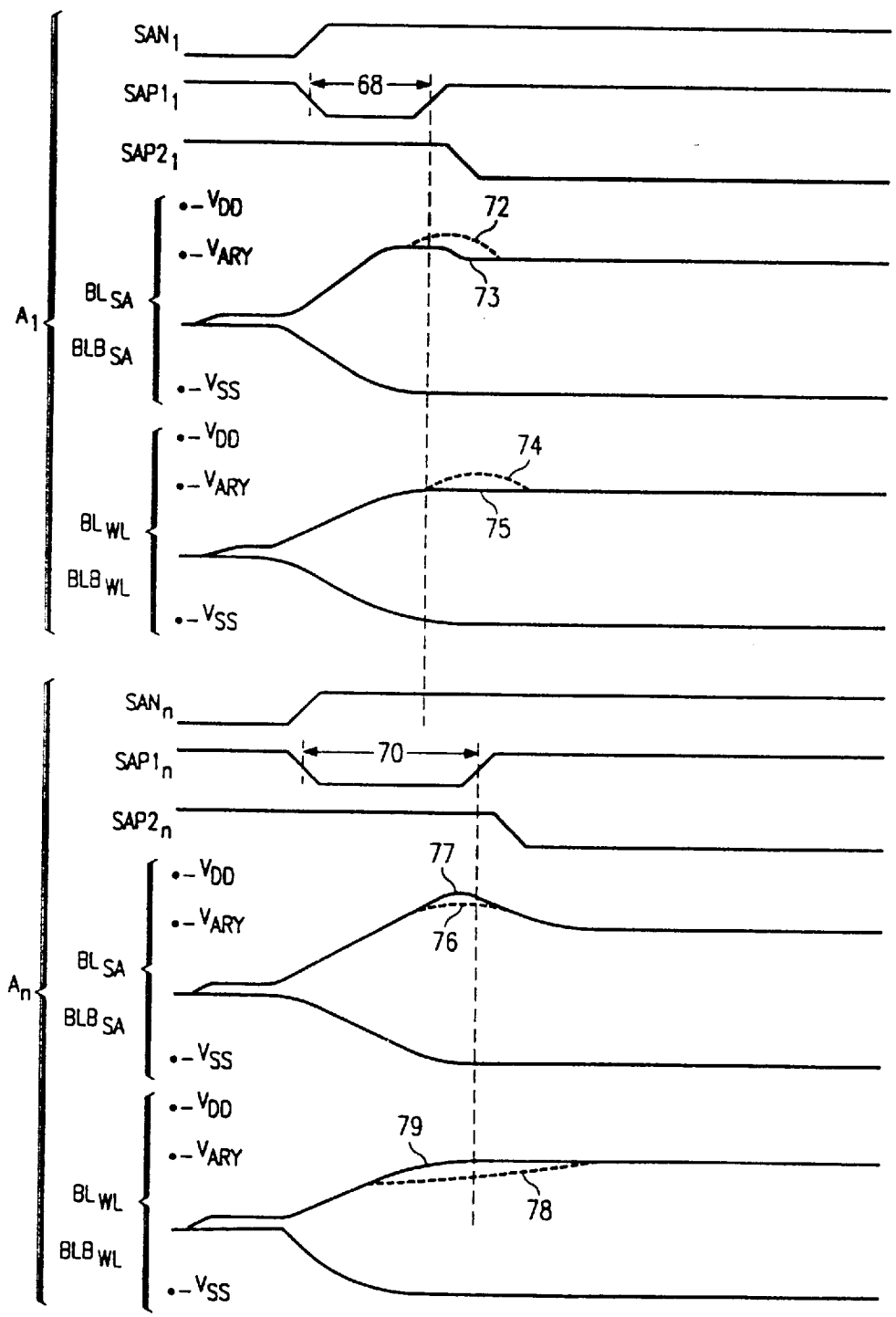
FIG. 10 is a timing diagram of a preferred implementation of an overdrive circuit of the present invention.
Figure 11:
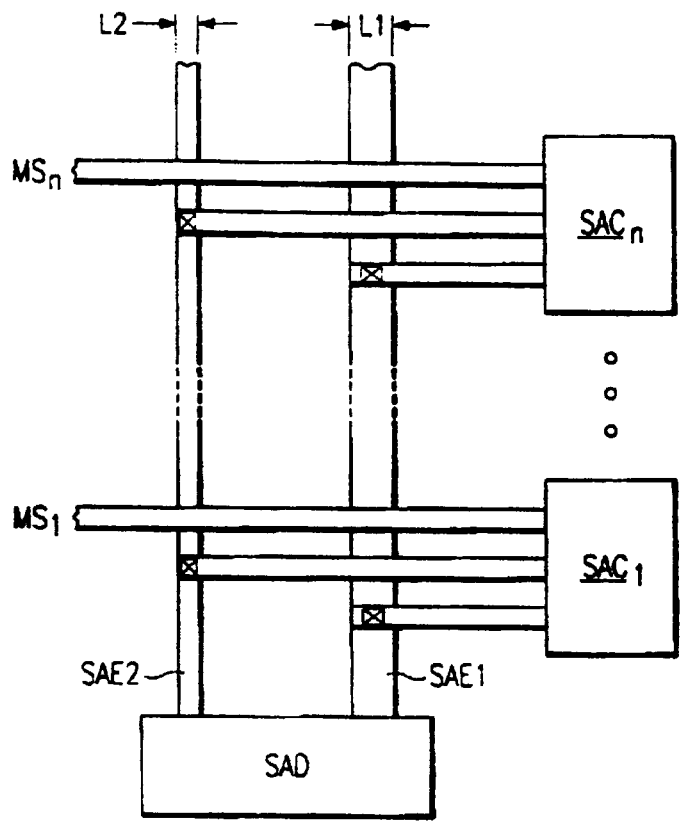
FIG. 11 is a schematic diagram of the preferred implementation of the overdrive circuit of the present invention.

Referring to FIG. 10, and in particular, the solid-lined waveforms, in a preferred implementation, the benefits of the prior two implementation are realized by a number of design considerations. First, referring also to FIGS. 3–4, the size of the SAE1 driver is made larger than the size of the SAE2 driver. Second, referring to FIGS. 3 and 11, a width L1 of the SAE1 signal line is made larger than a width L2 of the SAE2 signal line. In this manner, the resistance of the SAE2 signal line is made greater than that of the SAE1 signal line. As a result, the R-C time constant ($t^{RC}$) for the SAE2 signal line is large, as compared to the SAE1 signal line. Accordingly, at the subarray $A_{1,1}$, the SAE1 signal transitions quickly, and the SAE2 signal transitions quickly. As a result, an overdrive period 68 for the subarray $A_{1,1}$ is relatively short, similar to the overdrive period 64 of FIG. 8. However, because the SAE2 driver is smaller than the SAE1 driver, and the RC constant of the SAE2 signal line is greater than that of the SAE1 signal line, the SAE2 signal at the subarray $A_{1,n}$, will transition slower than the SAE1 signal. As a result, an overdrive period 70 for the subarray $A_{1,n}$ is relatively long, similar to the overdrive period 66 of FIG. 9.

Figure 12:
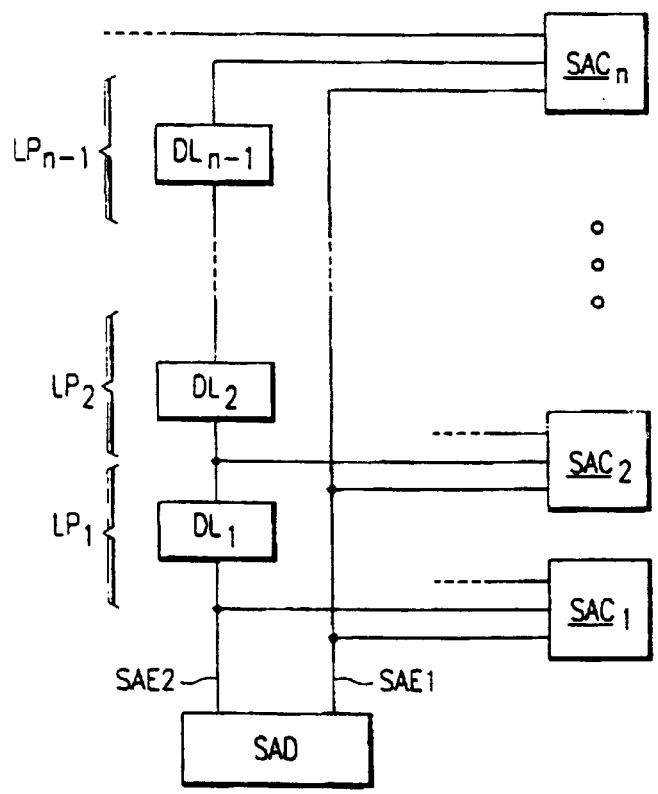
FIG. 12 is another schematic diagram of the preferred implementation of the overdrive circuit of the present invention.

A third design consideration, referring also to FIGS. 3 and 12, may be utilized to adjust the period of overdrive. For example, at line portions $LP_1, LP_2, \ldots LP_{n-1}$ of the SAE2 signal, delay circuits $DL_1, DL_2, \ldots DL_{n-1}$ are placed between each SAC circuit. As a result, the SAE2 signal transitions slower at the subarray $A_{1,n}$ than at the subarray $A_{1,1}$, and the overdrive period 70 for the subarray $A_{1,n}$ is relatively long, compared with the overdrive period 68 for the subarray $A_{1,1}$. Although not shown, in addition to or instead of the delay circuits, monitor circuits may be implemented for monitoring bit line voltages and adjusting the overdrive period, accordingly. Furthermore, the delay circuits may be used in combination with the previously mentioned design considerations.

Referring again to FIG. 10, the improvements of the different length overdrive periods 68 and 70, are illustrated by the solid-line waveforms and the dotted-line waveforms. The dotted-lines 72 and 74 represent the corresponding waveforms for $BL_{SA}(A_1)$ and $BL_{WL}(A_1)$ of FIG. 9. The solid-line waveforms 73 and 75, which are the actual waveforms for the preferred implementation, are similar to the corresponding waveforms for $BL_{SA}(A_{1,1})$ and $BL_{WL}(A_{1,1})$ of FIG. 8. This is because the overdrive period 68 is approximately equal to the overdrive period 64 of FIG. 8, thereby maintaining all the benefits of having an overdrive period optimized for the subarray $A_1$. In addition, the dotted lines 76 and 78 represent the corresponding waveforms for $BL_{SA}(A_{1,n})$ and $BL_{WL}(A_{1,n})$ of FIG. 8. The solid line waveforms 77 and 79, which are the actual waveforms for the preferred implementation, are similar to the corresponding waveforms for $BL_{SA}(A_{1,n})$ and $BL_{WL}(A_{1,n})$ of FIG. 9. This is because the overdrive period 70 is approximately equal to the overdrive period 66 of FIG. 9, thereby maintaining all the benefits of having an overdrive period optimized for the subarray $A_{1,n}$.

Although illustrative embodiments of the present invention have been shown and described, a latitude of modification, change and substitution is intended in the foregoing disclosure, and in certain instances, some features of the invention will be employed without a corresponding use of other features. For example, an alternative embodiment may be created for controlled overdriving of the low-going bit line with a voltage that exceeds VSS in the negative direction. Furthermore, additional buffers, drivers, delay circuits and other circuits may be added to the illustrative embodiment without altering the scope of the invention. Accordingly, it is appropriate that the appended claims be construed broadly and in a manner consistent with the scope of the invention.

What is claimed is:

1. A semiconductor memory comprising:
   a pair of bit lines;
   a plurality of word lines;
   a plurality of dynamic memory cells each of which is coupled to one of said pair of bit lines and one of said plurality of word lines;
   a sense amplifier including a pair of PMOS transistors and a pair of NMOS transistors, each of said pairs of PMOS and NMOS transistors having sources coupled in common, drains coupled to said pair of bit lines, respectively, and gates cross-coupled to said drains, respectively;
   a first power supply terminal;
   a second power supply terminal;
   a first switch transistor coupled between said first power supply terminal and said sources of said pair of PMOS transistors;
   a second switch transistor coupled between said second power supply terminal and said sources of said pair of PMOS transistors; and
   a voltage generator for providing said first power supply terminal with a first voltage that is lower than a second voltage supplied to said second power supply terminal,
   wherein said sense amplifier provides said pair of bit lines with a pair of complementary signals having a high side voltage and a low side voltage on the basis of information of a memory cell selected from said plurality of dynamic memory cells,
   wherein, in a first period, said high side voltage is raised over said first voltage in response to said second switch transistor being enabled, and
   wherein, in a second period following said first period, said high side voltage is lowered in response to said first switch transistor being enabled so that said high side voltage is set to said first voltage.

2. A semiconductor memory according to claim 1, wherein said voltage generator has a discharge circuit for lowering said high side voltage.

3. A semiconductor memory according to claim 2, further comprising:
   a third power supply terminal for receiving a third voltage; and
   a third switch transistor coupled between said third power supply terminal and said sources of said pair of NMOS transistors,
   wherein, in said first and second periods, said low side voltage is set to said third voltage in response to said third switch transistor being enabled.

4. A semiconductor memory comprising:
   first and second power supply terminals;
   first and second power supply lines, each of which has a first end coupled to the corresponding one of said first and second power supply terminals and extends in the same direction as each other;
   first and second memory blocks, each of which comprises a plurality of pairs of bit lines, a plurality of word lines, a plurality of dynamic memory cells and a plurality of sense amplifiers coupled to said plurality of pairs of bit lines, respectively, wherein each of said plurality of sense amplifiers includes a pair of PMOS transistors and a pair of NMOS transistors, and wherein each of said pairs of PMOS and NMOS transistors has sources coupled in common, drains coupled to the corresponding pair of bit lines, respectively, and gates cross-coupled to said drains, respectively;
   a first switch transistor coupled between a first portion of said first power supply line and said sources of pairs of said PMOS transistors in said first memory block;
   a second switch transistor coupled between a second portion of said second power supply line and said sources of said pairs of PMOS transistors in said first memory block;
   a third switch transistor coupled between a third portion of said first power supply line and said sources of said pairs of PMOS transistors in said second memory block;
   a fourth switch transistor coupled between a fourth portion of said second power supply line and said sources of said pairs of PMOS transistors in said second memory block; and
   a voltage generator for providing said first power supply terminal with a first voltage which is lower than a second voltage supplied to said second power supply terminal,
   wherein said first portion of said first power supply line is located between said third portion of said first power supply line and said first power supply terminal,
   wherein said second portion of said second power supply line is located between said fourth portion of said power supply line and said second power supply terminal, wherein each of said sense amplifiers in said first memory block provides the corresponding pair of bit line with a pair of first complementary signals having a high side voltage and a low side voltage on the basis of information stored in a memory cell selected from said plurality of dynamic memory cells in said first memory block, wherein, in a first period, said high side voltage of said pair of first complementary signals is raised over said first voltage in response to said second switch transistor being enabled, and wherein, in a second period following said first period, said high side voltage of said pair of first complementary signals is lowered in response to said first switch transistor being enabled so that said high side voltage is set to said first voltage.

5. A semiconductor memory according to claim 4, wherein each of said sense amplifiers in said second memory block provides the corresponding pair of bit lines with a pair of second complementary signals having a high side voltage and a low side voltage on the basis of information stored in a memory cell selected from said plurality of dynamic memory cells in said second memory block, wherein, in a third period, said high side voltage of said pair of second complementary signals is raised in response to said fourth switch transistor being enabled, and wherein, in a fourth period following said third period, said high side voltage of said pair of second complementary signals is raised continuously in response to said third switch transistor being enabled so that said high side voltage is set to said first voltage.

6. A semiconductor memory according to claim 5, further comprising fifth and sixth switch transistors wherein each of said pair of bit lines, comprising a first bit line and a second bit line, is divided into a first portion coupled to said respective dynamic memory cell and a second portion coupled to said pair of PMOS transistors of said sense amplifier, said fifth switch transistor is serially connected between said first and second portion of said first bit line, said sixth switch transistor is serially connected between said first and second portion of said second bit line, and, in said first and third periods, said high side voltage of said first portions of said pair of bit lines is raised over said first voltage in response to said third and fourth switch transistors being enabled.

7. A semiconductor memory according to claim 6, wherein said third period is longer than said first period.

8. A semiconductor memory according to claim 7, wherein said second and fourth switch transistors are enabled from a same timing.

9. A semiconductor memory according to claim 8, wherein, in said first and third periods, said high side voltage of said first portions of said pair of bit lines is lowered to be at most equal with said first voltage.

10. In an integrated circuit having an amplifier circuit, a method for driving a data signal to the amplifier circuit at a desired level comprising:

providing an enable circuit for generating a first and second enable signal;

overdriving the data signal with an overdrive voltage for a first period;

driving the data signal with a second voltage for a second period, wherein the second voltage pulls the data signal to the desired level;

wherein the first period is initiated by the first enable signal and the second period is initiated by the second enable signal and a length of the first period is responsive to the location of the enable circuit relative to the amplifier circuit.

11. The method of claim 10 wherein the overdrive voltage exceeds the desired level.

12. A method for driving first and second signals of an integrated circuit to a desired voltage level comprising:

providing an overdrive voltage at a level that exceeds the desired voltage level and a second voltage at the desired voltage level;

overdriving the first signal with an overdrive voltage for a first period;

overdriving the second signal with the overdrive voltage for a second period;

driving the first signal with a second voltage for a third period; and driving the second signal with the second voltage for a fourth period.

13. The method of claim 12 further comprising:

providing a first enable signal to initiate the first and second periods; and providing a second enable signal to conclude the first and second periods and initiate the third and fourth periods.

14. The method of claim 13 wherein the first and second signals are used in a first and second circuit, the enable signals are generated by an enable circuit, and a length of the first and second periods are responsive to the location of the first signal circuit relative to the enable signal circuit, and lengths of the third and fourth periods are responsive to the location of the second signal circuit relative to the enable signal circuit.

15. The method of claim 13 wherein the first and second periods are of different lengths.

16. The method of claim 15 wherein the first signal initiates the first and second periods at approximately the same time, and the second signal concludes the first period before the second signal concludes the second period.

17. The method of claim 16 wherein the first and second signals are utilized in a first and second circuit, respectively, and the time difference between the length of the first period and the length of the second period is responsive to the relative location of the first and second circuits.

18. The method of claim 13 wherein the second voltage is less than the desired level for a first portion of the third and fourth periods, and equal to the desired level for the remaining portion of the third and fourth periods.

19. An apparatus for driving a data signal in an integrated circuit to a desired level comprising:

a first circuit for overdriving the data signal with an overdrive voltage for a first period;

a second circuit for driving the data signal with a second voltage for a second period to pull the data signal to the desired level; and an enable circuit for generating a first and second enable signal wherein the first enable signal initiates the first period and the second enable signal concludes the first period and initiates the second period and wherein the timing of the generation of the second enable signal is responsive to the distance between the location of the enable circuit and the location of the data circuitry.

20. The apparatus of claim 19 wherein the means for overdriving the data signal with the overdrive voltage pulls the signal above the desired level.

21. A circuit for driving first and second signals to a desired level comprising:

means for providing an overdrive voltage at a level that exceeds the desired voltage level, and a second voltage at a second voltage level;

means for overdriving the first signal with an overdrive voltage for a first period;

means for overdriving the second signal with the overdrive voltage for a second period;

means for driving the first signal with a second voltage for a third period; and means for driving the second signal with the second voltage for a fourth period;

wherein the second voltage pulls the first and second signals to the desired level.

22. The circuit of claim 21 further comprising means for generating a first enable signal for initiating the first and second periods and means for generating a second enable signal for concluding the first and second periods and initiating the third and fourth periods.

23. The circuit of claim 22 wherein the means for overdriving the first signal and the means for overdriving the second signal are identical circuits, and a length of the first period is longer than a length of the second period.

24. The circuit of claim 23 wherein the difference in the lengths of the first and second periods is responsive to the location of the means for overdriving the first signal, and the means for overdriving the second signal with respect to the means for generating a first enable signal.

25. The circuit of claim 24 wherein the first signal initiates the first and second periods at approximately the same time, and the second signal concludes the first period before the second signal concludes the second period.

26. The circuit of claim 25 wherein a length of time between the conclusion of the first period and the second period is determined by the location of the first and second signal.

27. The circuit of claim 22 wherein the second voltage is less than the desired level for a first portion of the third and fourth periods, and equal to the desired level for the remaining portion of the third and fourth periods.

28. A dynamic random access memory structure comprising:

means for supplying a VDD voltage level;
means for supplying a VSS voltage level;
a voltage circuit for supplying a V1 voltage level;
a first bit line having a first voltage level signal thereon;
a second bit line having a second voltage level signal thereon;
a first sense amplifier circuit connected to the first bit line for driving the first voltage signal to the V1 voltage level;
a second sense amplifier circuit connected to the second bit line for driving the second voltage signal to the V1 voltage level;
a control circuit comprising:
  means for overdriving the first sense amplifier with the VDD voltage level for a first period;
  means for overdriving the second sense amplifier with the VDD voltage level for a second period;
  means for driving the first bit line with the V1 voltage level for a third period; and
  means for driving the second bit line with the V1 voltage level for a fourth period,
wherein the voltage level signals on first and second bit lines are driven past the V1 voltage level during the first and second period, and to the V1 voltage level during the third and fourth period.

29. The control circuit of claim 28 further comprising an enable circuit for generating a first enable signal for initiating the first and second periods and a second enable signal for concluding the first and second periods and initiating the third and fourth periods.

30. The control circuit of claim 29 wherein a length of each of the first and third periods is responsive to the location of the first sense amplifier relative to the enable circuit, and a length of each of the second and fourth periods is responsive to the location of the second sense amplifier relative to the enable circuit.

31. The control circuit of claim 30 wherein the lengths of the first and second periods are different.

32. The control circuit of claim 31 wherein the first signal initiates the first and second periods at approximately the same time, and the second signal concludes the first period before the second signal concludes the second period.

33. The control circuit of claim 32 wherein a length of time between the conclusion of the first period and the second period is determine by the location of the first and second bit line.

34. The control circuit of claim 29 wherein the V1 voltage level is lower than a desired level for a first portion of the third and fourth periods, and equal to the desired level for the remaining portion of the third and fourth periods.

35. A semiconductor memory comprising:

first and second power supply terminals;
first and second power supply lines, each of which has a first end coupled to the corresponding one of said first and second power supply terminals and extends in the same direction as each other;
first and second memory blocks, each of which comprises a plurality of pairs of data lines, a plurality of word lines, a plurality of dynamic memory cells and a plurality of sense amplifiers coupled to said plurality of pairs of bit lines, respectively, wherein each of said plurality of sense amplifiers includes a pair of PMOS transistors and a pair of NMOS transistors, and wherein each of pairs of PMOS and NMOS transistors has sources coupled in common, drains coupled to the corresponding pair of bit lines, respectively, and gates cross-coupled to said drains, respectively;
a first switch transistor coupled between a first portion of said first power supply line and said sources of pairs of PMOS transistors in said first memory block;
a second switch transistor coupled between a second portion of said second power supply line and said sources of said pairs of PMOS transistors in said first memory block;
a third switch transistor coupled between a third portion of said first power supply line and said sources of said pairs of PMOS transistors in said second memory block;
a fourth switch transistor coupled between a fourth portion of said second power supply line and said sources of said pairs of PMOS transistors in said second memory block;
a first signal line which has a first end coupled to a first signal terminal and extends in the same direction as said first and second power supply lines;
a first control circuit, coupled to a fifth portion of said first signal line, controlling said first and second switches; and
a second control circuit, coupled to a sixth of said first control signal line, controlling said third and fourth switches, wherein a first voltage supplied to said first power supply terminal is lower than a second voltage supplied to said second power supply terminal, wherein said first portion of said first power supply line is located between said third portion of said first power supply line and said first power supply terminal, wherein said second portion of said second power supply line is located between said forth portion of said second power supply line and said second power supply terminal, wherein said fifth portion of said first signal line is located between said sixth portion of said first signal line and said first signal terminal, wherein each of said sense amplifiers provides the corresponding pair of bit lines with a pair of first complementary signals having a high side voltage and a low side voltage on the basis of information stored in a memory cell selected from said plurality of dynamic memory cells, wherein said second switch transistors is enabled in a first period, and said first switch transistor is enabled in a second period following to said first period, and wherein said fourth switch transistor is enabled in a third period, and said third switch transistor is enabled in a fourth period following to said third period.

36. A semiconductor memory according to claim 35, said first signal line has a delay portion between said fifth portion and sixth portion so that said third period is longer than said first period.

37. A semiconductor memory according to claim 35, further comprising a second signal line which has a first end coupled to a second signal terminal and extends in the same direction as said first signal line, wherein turn-on timing of each of said first and third switches is determined on the basis of a signal supplied to said second signal terminal, wherein turn-off timing of each of said first and third switches is determined on the basis of a signal supplied to said second signal terminal, wherein a width of said second signal line is larger than a width of said first signal line so that said third period is longer than said first period.

* * * * *

UNITED STATES PATENT AND TRADEMARK OFFICE
CERTIFICATE OF CORRECTION

PATENT NO.   : 5,859,807
DATED        : January 12, 1999
INVENTOR(S)  : Otori et al.

It is certified that error appears in the above-identified patent and that said Letters Patent is hereby corrected as shown below:

<u>Title page,</u>
Item [73], Assignee, please change to read as follows:
-- HITACHI, LTD, Tokyo, Japan and
   TEXAS INSTRUMENTS INCORPORATED, Dallas, Texas --

Signed and Sealed this

Seventh Day of June, 2005

JON W. DUDAS
*Director of the United States Patent and Trademark Office*